United States Patent [19]

Tan et al.

[11] Patent Number: 4,803,828
[45] Date of Patent: Feb. 14, 1989

[54] FIXTURE FOR PGA CARRIERS

[75] Inventors: H. Wayne Tan; Danh C. Tran; Walter McGreevy, all of San Jose, Calif.

[73] Assignee: Advanced Micro Devices, Inc., Sunnyvale, Calif.

[21] Appl. No.: 79,729

[22] Filed: Jul. 30, 1987

[51] Int. Cl.⁴ .............................................. B23Q 3/02
[52] U.S. Cl. ...................................... 53/390; 53/393; 269/238
[58] Field of Search .................. 53/390, 393; 269/238

[56] References Cited

U.S. PATENT DOCUMENTS

| | | | |
|---|---|---|---|
| 1,536,310 | 5/1925 | Rothlisberger | 269/238 X |
| 2,364,239 | 12/1944 | Parks | 269/238 X |
| 4,489,926 | 12/1984 | Blatrix | 269/238 X |

Primary Examiner—James F. Coan
Attorney, Agent, or Firm—Davis Chin

[57] ABSTRACT

A fixture for loading and unloading of a PGA chip package (12) into and out of a chip carrier (10) includes a substantially rectangular-shaped solid body member (56) having a central cavity (58). The body member is formed of a left side member (60), a right side member (62), a top side member (64), and a bottom side member (68). A first actuator (70a) is formed on an interior surface (68) of the left side member for contacting a first tab (38a) of the chip carrier (10). The first actuator (70a) includes a first outer, upwardly extending projection (72a) and a first inner, downwardly extending projection (76a). A second actuator (70b) is formed on an interior surface (69) of the right side member for contacting a second tab (38b) of the chip carrier (10). The second actuator (70b) includes a second outer, upwardly extending projection (72b) and a second inner, downwardly extending projection (76b). The first and second upwardly extending projections (72a, 72b) are used to move the tabs from an unlatched position to a latched position so as to allow for the loading and unloading of the chip package. The first and second downwardly extending projections (76a, 76b) are used to move the tabs from the latched position back to the unlatched position so as to retain the package in the chip carrier.

20 Claims, 2 Drawing Sheets

FIXTURE FOR PGA CARRIERS

DESCRIPTION

BACKGROUND OF THE INVENTION

This invention relates generally to pin grid array (PGA) integrated circuit chip packages and more particularly, it relates to a fixture for loading and unloading of a PGA package into and out of a chip carrier.

In recent years, there has arisen a need for high density packaging for large scale integration (LSI) devices. In response to this demand, there has been developed in the industry a common arrangement referred to in the art as a pin grid array (PGA) chip package. Typically, the PGA chip package includes a main body member having a generally rectangular or square configuration. A plurality of metal terminal pins extend from the top surface of the body member to protrude from its bottom surface. The plurality of pins are disposed in the form of rows and columns so as to provide a matrix array. In order to protect the terminal pins of the PGA packages from being bent, damaged or possible destruction during handling, testing and shipping, the PGA packages are generally mounted or loaded into some kind of chip carrier. One conventional kind of chip carrier in the art has a centrally disposed recess and releasable tabs extending on two opposite sides of the carrier forming what is known as a Murphy type carrier.

There has been encountered the problem of unlatching of the releasable tabs after the unloading of the Murphy type carriers containing the PGA chip packages in order to remove the chip packages themselves for subsequent use. In a production environment, the worker would use any type of pointed object such as tweezers or a ball point pen to unlatch the tabs and remove the chip package from the carrier. However, this was a very time-consuming process, thereby increasing labor costs. Further, the tweezers and ball point pens could possibly cause damage to the carrier tabs. Many times, the tabs would be left in the unlatched position after removal of the chip package. As a result, the resiliency of the tabs would eventually be lost, thus rendering the carrier to be useless.

It is therefore believed what is needed is a more or less universal fixture for loading and unloading of PGA chip packages into and out of Murphy type carriers in an efficient and effective manner. It would also be expedient to provide a fixture which is formed of a relatively simple construction and can be easily operated without the need of complicated instructions for unlatching and latching of the carrier tabs but yet has enough strength to withstand normal physical abuses in the production environment. The fixture of the present invention for unloading and loading of the chip package has been designed with all of these features which have been traditionally unavailable.

SUMMARY OF THE INVENTION

Accordingly, it is a generally object of the present invention to provide a fixture of a design which can be employed for loading and unloading of PGA packages into and out of Murphy type carriers in an efficient and effective manner.

It is an object of the present invention to provide a fixture for unlatching and latching of carrier tabs which is formed of a relatively simple construction and can be easily operated without the need of complicated instructions.

It is another object of the present invention to provide a fixture for loading and unloading of a PGA chip package into and out of a chip carrier which is fabricated from a material which has enough strength to withstand normal physical abuses in the production environment.

It is still another object of the present invention to provide a fixture for loading and unloading of a PGA chip package into and out of a chip carrier which includes first projection means for moving of the carrier tabs from an unlatched position to a latched position so as to allow for the loading and unloading of the chip package and second projection means for moving of tabs from the latched position back to the unlatched position so as to retain the chip package in the carrier.

In accordance with these aims and objectives, the present invention is concerned with the provision of a fixture for loading and unloading of a pin grid array (PGA) chip package into and out of a chip carrier which includes a substantially rectangularly-shaped solid body member having a central cavity. The body member is formed of a left side member, a right side member, a top member and a bottom member. A first actuator is formed on an interior surface of the left side member for contacting a first tab of the chip carrier. The first actuator includes a first outer, upwardly extending projection and a first inner, downwardly extending projection. A second actuator is formed on an interior surface of the right side member for moving a second tab of the chip carrier. The second actuator includes a second outer, upwardly extending projection and a second inner, downwardly extending projection. The upwardly extending projections are used to move the tabs from an unlatched position to a latched position so as to allow for the loading and unloading of the chip package. The downwardly extending projections are used to move the tabs from the latched position back to the unlatched position so as to retain the package in the chip carrier.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENT

Figure 2:
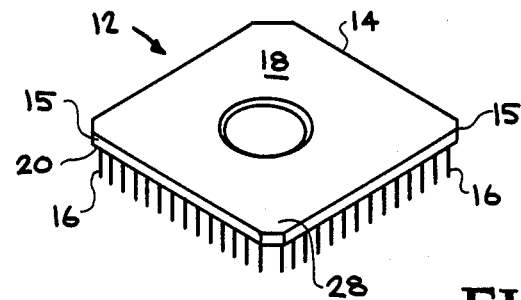
FIG. 2 is a perspective view of a typical pin grid array chip package.
Figure 1:
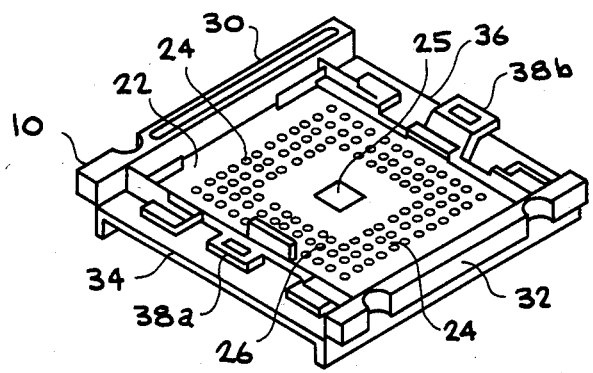
FIG. 1 is a perspective view of a conventional Murphy type carrier.

Referring now in detail to the various views of the drawings, there is shown in FIG. 1 a perspective view of a conventional Murphy type carrier 10 which is used to protect the terminal pins of a pin grid array (PGA) chip package 12 (FIG. 2) from being bent, damaged or possible destruction during handling, testing and shipping. The PGA chip package 12 includes a main body member 14 having a generally rectangular or square configuration in which the dimensions of the four edges are varying in width and length. This is due to the fact that the chip package size is dependent upon the number of terminal pins which may vary from sixty-eight to one hundred sixty-eight. A plurality of metal terminal pins 16 extend from a top surface 18 of the body member 14 to protrude from its bottom surface 20. The plurality of terminal pins 16 are disposed in the form of rows and columns so as to provide a matrix array. The body member 14 has four side portions 15 each being of a dimension approximately 1.750 inches in length and 0.200 inches in height.

The Murphy type carrier 10 of FIG. 1 is designed to be of a substantially rectangular-shaped solid body member with a centrally disposed recess or cavity 22. The cavity 22 is formed with a plurality of openings or holes 24 aligned in rows and columns to receive the pins 16 of the PGA chip package 12. The recess 22 includes a central opening 25 and an indexing hole or opening 26 for receiving an indexing pin 28 of the PGA chip package so as to prevent an undesired orientation.

The chip carrier 10 is preferably of a square-shaped configuration and has four side portions consisting of a top side portion 30, a bottom side portion 32, a left side portion 34, and a right side portion 36. The dimension of each of the four side portions 30–36 is approximately 2.750 inches in length. At the intermediate area of the left side portion 34, there is provided a movable or releasable tab 38a having a horizontal section 40a, a vertical section 42a and an inwardly sloping section 44a integrally connecting the vertical section to the horizontal section.

Similarly, at the intermediate area of the right side portion 36 opposite the left side portion 34, there is provided a movable or releasable tab 38b having a horizontal section 40b, a vertical section 42b, and an inwardly sloping section 44b integrally connecting the vertical section to the horizontal section. The vertical sections 42a and 42b of the respective tabs 38a and 38b are used to retain or captivate the PGA chip package 14 in the cavity 22 of the chip carrier 10 as will be explained more fully in detail hereinbelow.

The tabs 38a and 38b are typically made of a resilient material so as to permit an outward bending thereof.

Figure 4:
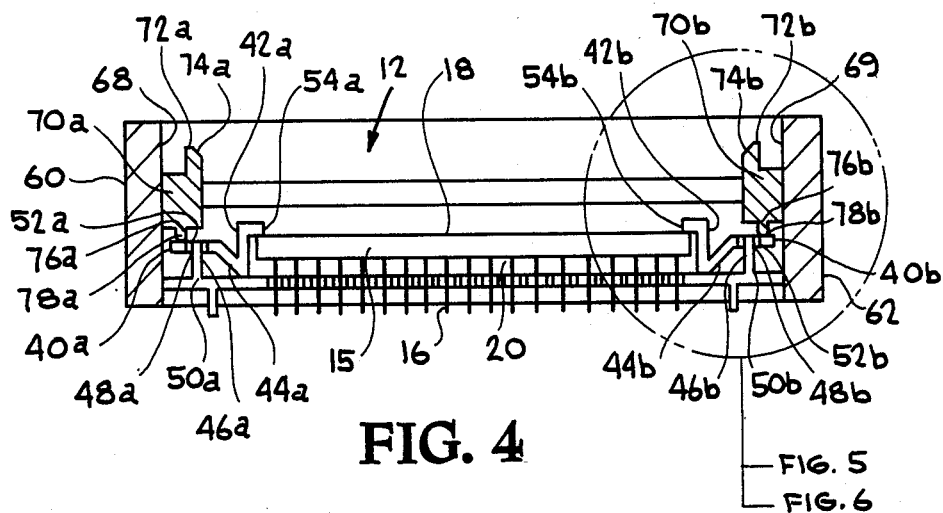
FIG. 4 is a cross-sectional view of the carrier, package and fixture with the tabs in the closed position.

As can best be seen from FIG. 4, the horizontal section 40a has a rectangularly-shaped slot 46a disposed centrally on its top surface. Below the slot 46a adjacent the outer edge 48a thereof, there is provided a vertical projection 50a extending from the top surface of the chip carrier 10. The upper end of the projection 50a includes a downwardly and outwardly sloping surface 52a. The vertical section 42a has a hooked portion 54a disposed at its upper end which is used to releasably engage the top surface 18 of the chip package 12 so as to retain the same. Similarly, the horizontal section 40b has a rectangularly-shaped slot 46b disposed centrally on its top surface. Below the slot 46b adjacent the outer edge 48b thereof, there is provided a vertical projection 50b extending from the top surface of the chip carrier. The upper end of the projection 50b includes a downwardly and outwardly sloping surface 52b. The vertical section 42b has a hooked portion 54b disposed at its upper end which is used to releasably engage the top surface 18 of the chip package 12 so as to retain the same.

Figure 3:
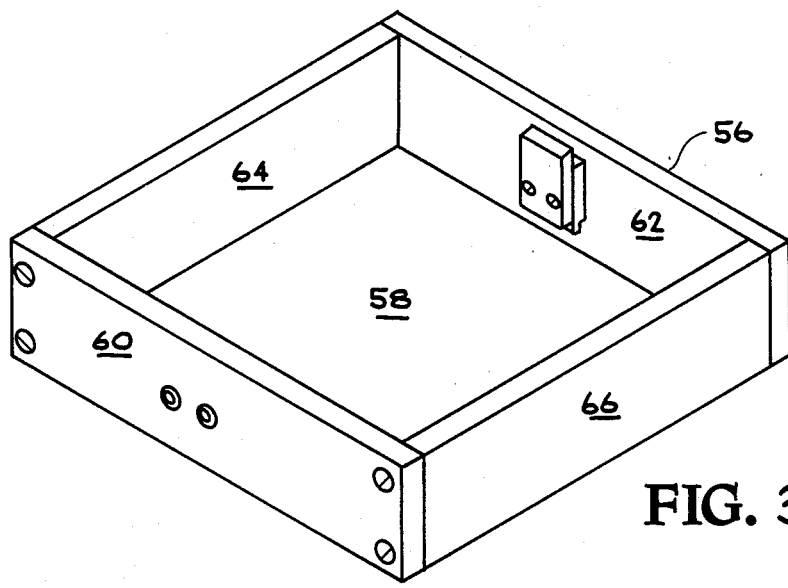
FIG. 3 is a perspective view of a fixture constructed in accordance with the principles of the present invention.

Referring now to FIG. 3 of the drawings, there is shown a fixture 56 of the present invention which is used for latching and unlatching of the carrier tabs 38a, 38b of the chip carrier 10 so as to permit loading and unloading of the PGA chip package 12. The fixture 56 has a substantial rectangularly-shaped solid body member with a central opening 58. The fixture 56 is preferably of a square-shaped configuration and has a left side member 60, a right side member 62, a top member 64 and a bottom member 66. The dimension of each of the side members 60, 62 is approximately 3.250 inches in length, 0.250 inches in width, and 1.000 inches in height. The dimension of each of the top and bottom members 64, 66 is approximately 2.750 inches in length, 0.250 inches in width, and 1.000 inches in height. The fixture 56 is thus basically a 3.250 inch solid square structure having the central opening 58 within inner lateral dimensions conforming substantially to the outer lateral dimensions of the chip carrier 10 so as to surround all of the edges of the same.

The side member 60 has formed on its interior surface 68 at its intermediate area a first actuator 70a having a generally rectangularly-shaped body. The body of the first actuator 70a, as can best be seen from FIG. 4, has disposed on its top surface a first outer, upwardly extending projection 72a with a substantially semicircular end portion 74a. Further, the bottom surface of the first actuator 70a has disposed thereon a second inner, downwardly extending projection 76a with a substantially semi-circular end portion 78a. Similarly, the side member 62 has formed on its interior surface 69 at its intermediate area a second actuator 70b having a generally rectangular-shaped body. The body of the second actuator 70b, as seen from FIG. 4, has disposed on its top surface a second outer, upwardly extending projection 72b with a substantially semi-circular end 74b. Further, the bottom surface of the second actuator 70b has disposed thereon a second inner, downwardly extending projection 76b with a substantially semi-circular end portion 78b.

Figure 5:
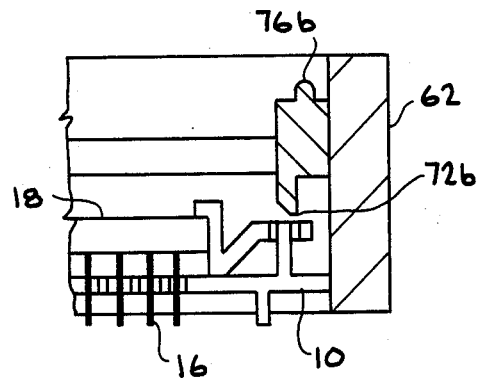
FIG. 5 is an enlarged view of a portion of the carrier, package and fixture showing the tab in the closed position.
Figure 6:
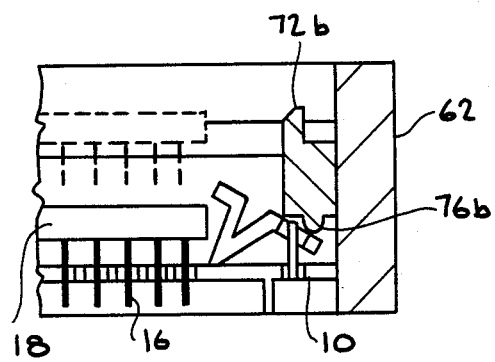
FIG. 6 is an enlarged view of a portion of the carrier, package and fixture showing the tab in the open position.

In order to permit the easy insertion of the chip package 12 into the chip carrier 10, the fixture 56 is initially placed over the chip carrier 10 so that the respective first and second outer projections 72a, 72b are aligned above the corresponding inwardly sloping surfaces 44a, 44b of the respective tabs 38a, 38b. An enlarged view of a portion of the carrier, package and fixture showing the tab in the closed (unlatched) position is shown in FIG. 5. By applying a downward force on the fixture 56, each of the horizontal sections, sloping sections and vertical sections function as a spring system and will deflect outward slightly so as to cause interengagement or mating of the sloping surfaces 52a, 52b with the outer edges 48a, 48b of the slots in the horizontal sections. As a result, the tabs 38a, 38b become latched in the open position so as to allow for loading of the chip package 12 into the chip carrier 10. An enlarged view of a portion of the carrier, package and fixture showing the tab 38b in the opened or latched position is illustrated in FIG. 6.

Also, as a result of this force, the vertical sections 42a, 42b are rotated outwardly by a slight amount. Then, the PGA chip package 12 can be inserted into the chip carrier 10 so that the terminal pins 16 are mated into the corresponding holes 24. It should be understood that the index pin 28 of the chip package 12 must be aligned with the index hole 26 of the chip carrier 10. Further, it should be noted that this latched or opened position should not be maintained for a very long time. Otherwise, the tabs will be stressed beyond their yield point and will be permanently deformed to the opened position. Accordingly, the fixture 56 is turned over or upside down and then placed over the chip carrier 10 so that the respective second inner projections 76a, 76b are aligned above the horizontal sections 40a, 40b of the tabs, as is depicted in FIG. 6. By applying again a downward force on the fixture 56, the horizontal sections 40a, 40b will be deflected inward slightly so as to disengage the outer edges 48a, 48b of the slots 46a, 46b from the sloping surfaces 52a, 52b of the vertical projections 50a, 50b. As a result, the tabs will move or spring back from the latched or open position shown in FIG. 6 to the unlatched or closed position shown in FIG. 4 due to its resiliency. Also, the hooked portions 54a, 54b will engage the top surface of the chip package 12 for retaining the same in the carrier.

The removal of the chip package 12 from the chip carrier 10 may be accomplished with a similar ease of operation. The fixture 56 is again placed over the chip carrier 10 so that the first outer projections 72a, 72b are aligned above the sloping surfaces 44a, 44b of the tabs. By applying a downward force, the tabs 38a, 38b will again be latched, as shown in FIG. 6, thereby disengaging the hooked portions 54a, 54b from the top surface of the chip package. Thereafter, the chip package 12 may be withdrawn from the chip carrier 10 by lifting of the same with an upward motion.

It should be noted that the fixture of the present invention described is an extremely simple structure which may be readily fabricated from a number of commercially available materials. For example, the top, bottom and side members may be formed of a metallic material which are joined together by fastening devices such as screws. In particular, the fixture is preferably made out of aluminum or the like so as to be economical in cost but yet have strength enough to withstand normal physical abuses in the production environment. While the fixture of the present invention has been described for use in connection with a chip package having 168 terminal pins, it should be apparent that the dimensions of the first and second actuators 70a and 70b may simply be altered in order to accommodate a chip package having a smaller number of terminal pins. Specifically, the dimension of the rectangularly-shaped body of the actuator would be increased so as to extend the same further toward the center of the chip carrier so as to be in alignment with the carrier tabs. Thus, the fixture of the present invention is somewhat universal in that the outer outline dimension of 3.250 inches is not required to be changed.

From the foregoing detailed description, it can thus be seen that the present invention provides a fixture for loading and unloading of a pin grid array (PGA) chip package into and out of a chip carrier. The fixture can be easily adapted to handle a wide range of chip packages with varying dimensions. Further, the fixture of the present invention is of an extremely simple construction but yet is strong enough to handle abuses encountered in the production environment.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but what the invention will include all embodiments falling within the scope of the appended claims.

What is claimed is:

1. A fixture for loading and unloading of a pin grid array (PGA) chip package (12) into and out of a chip carrier (10) comprising:
    a substantially rectangular-shaped solid body member having a central cavity (58), said body member being formed of a left side member (60), a right side member (62), a top side member (64), and a bottom side member (66);
    first actuating means (70a) being formed on an interior surface (68) of said left side member for contacting a first tab (38a) of the chip carrier (10);
    said first actuator means (70a) being formed of a first outer, upwardly extending projection (72a) and a first inner, downwardly extending projection (76a);
    second actuator means (70b) being formed on an interior surface (69) of said left side member for contacting a second tab (38b) of the chip carrier;
    said second actuator means being formed of a second outer, upwardly extending projection (72b) and a second inner, downwardly extending projection (76b);
    said first and second upwardly extending projections (72a, 72b) being used to move said first and second tabs from an unlatched position to a latched position so as to allow for the loading and unloading of the chip package; and
    said first and second downwardly extending projections (76a, 76b) being used to move said tabs from the latched position back to the unlatched position so as to retain the package in the chip carrier.

2. A fixture as claimed in claim 1, wherein said body member is formed of a metallic material.

3. A fixture as claimed in claim 2, wherein said metallic material comprises aluminum.

4. A fixture as claimed in claim 1, wherein said body member has a square-shaped configuration.

5. A fixture as claimed in claim 1, wherein said body member has inner lateral dimensions which conform substantially to the outer lateral dimensions of the chip carrier.

6. A fixture as claimed in claim 1, wherein each of said first and second upwardly extending projections (72a, 72b) has a substantially semi-circular end portion (74a, 74b).

7. A fixture as claimed in claim 1, wherein each of said first and second downwardly extending projections (76a, 76b) has a substantially semi-circular end portion (78a, 78b).

8. A fixture for loading and unloading a pin grid array (PGA) chip package (12) into and out of a chip carrier (10) comprising in combination:

the chip carrier having first and second releasable tabs (38a, 38b) disposed on opposite sides thereof;

said first tab (38a) being formed of a first horizontal section (40a), a first vertical section (42a), and a first inwardly sloping section (44a) integrally connecting the first vertical section (42a) to the first horizontal section (40a);

said second tab (38b) being formed of a second horizontal section (40b), a second vertical section (42b), and a second inwardly sloping section (44b) integrally connecting the second vertical section (42b) to the second horizontal section (40b);

a substantially rectangular-shaped solid body member having a central cavity (58), said body member being formed of a left side member (60), a right side member (64), a top side member, and a bottom side member (66);

first actuating means (70a) being formed on an interior surface (68) of said left side member for contacting said first tab (38a) of the chip carrier (10);

said first actuator means (70a) being formed of a first outer, upwardly extending projection (72a) and a first inner, downwardly extending projection (76a);

second actuator means (70b) being formed on an interior surface (69) of said left side member for contacting said second tab (38b) of the chip carrier (10);

said second actuator means (70b) being formed of a second outer, upwardly extending projection (72b) and a second inner, downwardly extending projection (76b);

said first and second upwardly extending projections (72a, 72b) being used to contact the respective first and second sloping sections (44a, 44b) of the corresponding first and second tabs (38a, 38b) so as to deflect slightly the tabs outward to permit the insertion and removal of the chip package; and said first and second downwardly extending projections (76a, 76b) being used to contact the first and second horizontal sections (44a, 44b) of the tabs so as to deflect slightly the tabs inward to retain the package in the chip carrier.

9. A fixture as claimed in claim 8, wherein said body member is formed of a metallic material.

10. A fixture as claimed in claim 9, wherein said metallic material comprises aluminum.

11. A fixture as claimed in claim 8, wherein said body member has a square-shaped configuration.

12. A fixture as claimed in claim 8, wherein said body member has inner lateral dimensions which conform substantially to the outer lateral dimensions of the chip carrier.

13. A fixture as claimed in claim 8, wherein each of said first and second upwardly extending projections (72a, 72b) has a substantially semi-circular end portion (74a, 74b).

14. A fixture as claimed in claim 8, wherein each of said first and second downwardly extending projections (76a, 76b) has a substantially semi-circular end portion (78a, 78b).

15. A fixture for loading and unloading of a pin grid array (PGA) chip package (12) into and out of a chip carrier (10) comprising:

first projection means (72a, 72b) for moving oppositely disposed tabs (38a, 38b) of the chip carrier (10) from an unlatched position to a latched position so as to allow for the loading and unloading of the chip package; and second projection means (76a, 76b) for moving said tabs (38a, 38b) of the chip carrier (10) from the latched position back to the unlatched position so as to retain the package in the chip carrier.

16. A fixture as claimed in claim 15, wherein said first projection means comprises a pair of outer, upwardly extending projections (72a, 72b).

17. A fixture as claimed in claim 16, wherein said second projection means comprises a pair of inner, downwardly extending projections (76a, 76b).

18. A fixture as claimed in claim 16, wherein said pair of upwardly extending projections (72a, 72b) each has a substantially semi-circular end portion (74a, 74b).

19. A fixture as claimed in claim 17, wherein said pair of downwardly extending projections (76a, 76b) each has a substantially semi-circular end portion (78a, 78b).

20. A fixture as claimed in claim 15, wherein said first and second projection means (72a, 72b, 76a, 76b) are formed on the interior surfaces (68, 69) of a substantially rectangular-shaped solid body member (56).

* * * * *